(12) United States Patent
Ma

(10) Patent No.: US 11,688,667 B2
(45) Date of Patent: *Jun. 27, 2023

(54) SEMICONDUCTOR PACKAGE INCLUDING A PAD PATTERN

(71) Applicant: Samsung Electronics Co., Ltd., Suwon-si (KR)

(72) Inventor: Keumhee Ma, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/473,290

(22) Filed: Sep. 13, 2021

(65) Prior Publication Data

US 2021/0407891 A1 Dec. 30, 2021

Related U.S. Application Data

(63) Continuation of application No. 16/896,529, filed on Jun. 9, 2020, now Pat. No. 11,145,573.

(30) Foreign Application Priority Data

Nov. 4, 2019 (KR) ........................ 10-2019-0139258

(51) Int. Cl.
*H01L 23/48* (2006.01)
*H01L 23/00* (2006.01)
*H01L 25/065* (2023.01)

(52) U.S. Cl.
CPC ............ *H01L 23/481* (2013.01); *H01L 24/06* (2013.01); *H01L 24/17* (2013.01);
(Continued)

(58) Field of Classification Search
CPC ....... H01L 23/481; H01L 24/06; H01L 24/17; H01L 25/0657; H01L 2225/06513;
(Continued)

(56) References Cited

U.S. PATENT DOCUMENTS 6,873,054 B2   3/2005  Miyazawa et al.
8,202,797 B2 *  6/2012  Chi ..................... H01L 21/568
                                                     257/737
(Continued)

FOREIGN PATENT DOCUMENTS

JP     2014170793 A  *  9/2014  ....... H01L 21/76898
JP     20140170793 A     9/2014
WO    WO-2011148444 A1 * 12/2011  ............. H01L 23/29

*Primary Examiner* — Mamadou L Diallo
(74) *Attorney, Agent, or Firm* — Harness, Dickey & Pierce, P.L.C.

(57) ABSTRACT

A semiconductor package may include a first semiconductor chip and a second semiconductor chip. The first semiconductor chip may include a first semiconductor substrate, a through via structure and a pad pattern. The first semiconductor substrate may include a first surface and a second surface opposite to the first surface, and the second surface may include a recess. The through via structure may pass through the first semiconductor substrate from the first surface to a bottom of the recess of the second surface. An upper surface of the through via structure may protrude from the bottom of the recess. The pad pattern may be electrically connected to the upper surface of the through via structure, and the pad pattern may include a first recess having a concave shape thereon. The second semiconductor chip may include a bump pattern bonded on an inside of the first recess of the pad pattern.

20 Claims, 13 Drawing Sheets

(52) U.S. Cl.
CPC .. *H01L 25/0657* (2013.01); *H01L 2224/0401* (2013.01); *H01L 2224/06181* (2013.01); *H01L 2224/17181* (2013.01); *H01L 2225/06513* (2013.01)

(58) Field of Classification Search
CPC . H01L 2224/06181; H01L 2224/17181; H01L 2224/0401
See application file for complete search history.

(56) References Cited

U.S. PATENT DOCUMENTS

| | | | |
|---|---|---|---|
| 8,604,616 B2* | 12/2013 | Lee | H01L 23/525 |
| | | | 257/784 |
| 8,610,264 B2 | 12/2013 | Oganesian et al. | |
| 9,472,490 B1* | 10/2016 | Sullivan | H01L 24/14 |
| 9,960,080 B2 | 5/2018 | Beyne | |
| 2006/0046468 A1* | 3/2006 | Akram | H01L 21/76898 |
| | | | 257/E21.597 |
| 2008/0237881 A1 | 10/2008 | Dambrauskas et al. | |
| 2010/0038800 A1* | 2/2010 | Yoon | H01L 23/481 |
| | | | 257/E21.597 |
| 2013/0264720 A1* | 10/2013 | Chun | H01L 21/76898 |
| | | | 257/774 |
| 2016/0079093 A1* | 3/2016 | Tosaya | H01L 24/91 |
| | | | 257/774 |
| 2016/0086874 A1* | 3/2016 | Choi | H01L 21/76898 |
| | | | 257/774 |
| 2019/0279924 A1* | 9/2019 | Appelt | H01L 23/49517 |
| 2020/0168550 A1* | 5/2020 | Ryu | H01L 25/0652 |
| 2020/0251443 A1* | 8/2020 | Kanakamedala | H01L 24/94 |
| 2020/0273845 A1* | 8/2020 | Kato | H01L 23/5384 |
| 2021/0125955 A1* | 4/2021 | Suh | H01L 24/27 |
| 2022/0181504 A1* | 6/2022 | Sawada | H01L 29/0623 |

* cited by examiner

SEMICONDUCTOR PACKAGE INCLUDING A PAD PATTERN

CROSS-REFERENCE TO RELATED APPLICATIONS

This application is a continuation of U.S. application Ser. No. 16/896,529, filed on Jun. 9, 2020, which claims priority under 35 USC § 119 to Korean Patent Application No. 10-2019-0139258, filed on Nov. 4, 2019, in the Korean Intellectual Property Office (KIPO), the contents of each of which are incorporated by reference herein in their entirety.

BACKGROUND

1. Field

Example embodiments relate to a semiconductor package. More particularly, example embodiments relate to a semiconductor package including a structure in which semiconductor chips are stacked.

2. Description of the Related Art

In order to increase data storage capacity and performance of a semiconductor device, a semiconductor package including a plurality of stacked semiconductor chips may be used. Thus, methods for bonding and assembling of the semiconductor chips may be developed.

SUMMARY

Example embodiments provide a semiconductor package having reduced height and/or higher reliability.

According to example embodiments, there is provided a semiconductor package that may include a first semiconductor chip and a second semiconductor chip. The first semiconductor chip may include a first semiconductor substrate, a through via structure, and a pad pattern. The first semiconductor substrate may include a first surface and a second surface opposite to the first surface. The second surface may include a first semiconductor substrate recess. The through via structure may pass through the first semiconductor substrate from the first surface to a bottom of the first semiconductor substrate recess. An upper surface of the through via structure may protrude from the bottom of the first semiconductor substrate recess. The pad pattern may be electrically connected to the upper surface of the through via structure. The pad pattern may include a first pad pattern recess. The second semiconductor chip may be stacked on the first semiconductor chip. The second semiconductor chip may include a bump pattern on a first surface of a second semiconductor substrate. The bump pattern of the second semiconductor chip may be formed bonded on the pad pattern to fill the first pad pattern recess of the first semiconductor chip.

According to example embodiments, there is provided a semiconductor package that may include a first semiconductor chip, a second semiconductor chip and a third semiconductor chip. The first semiconductor chip may include a first semiconductor substrate, a first bump pattern, a first through via structure, a first insulation liner pattern and a first pad pattern. The first semiconductor substrate may include a first surface and a second surface opposite to the first surface. The second surface may include a first semiconductor substrate recess. The first bump pattern may be formed on the first surface of the first semiconductor substrate. The first through via structure may pass through the first semiconductor substrate from the first surface to a bottom of the first semiconductor substrate recess of the second surface. An upper surface of the first through via structure may protrude from the bottom of the first semiconductor substrate recess. The first insulation liner pattern may be formed on the second surface of the first semiconductor substrate, an inner surface of the first semiconductor substrate recess and an upper sidewall of the first through via structure. The first pad pattern formed on a surface of the first insulation liner pattern in the first semiconductor substrate recess, an upper surface of the first through via structure, and a portion of the first insulation liner pattern formed on the second surface of the first semiconductor substrate. The first pad pattern may include a first pad pattern recess having a concave shape. The second semiconductor chip may include a second semiconductor substrate, a second bump pattern, a second through via structure, a second insulation liner pattern and a second pad pattern. The second semiconductor substrate may include a first surface and a second surface opposite to the first surface, and the second surface may include a second semiconductor substrate recess. The second bump pattern may be formed on the first surface of the second semiconductor substrate. The second through via structure may pass through the second semiconductor substrate from the first surface to a bottom of the second semiconductor substrate recess of the second surface. An upper surface of the second through via structure may protrude from the bottom of the second semiconductor substrate recess. The second insulation liner pattern may be formed on the second surface of the second semiconductor substrate, an inner surface of the second semiconductor substrate recess and an upper sidewall of the second through via structure. The second pad pattern may be formed on a surface of the second insulation liner pattern in the second semiconductor substrate recess, the upper surface of the second through via structure, and a portion of the second insulation liner pattern formed on the second surface of the second semiconductor substrate. The second pad pattern may include a second pad pattern recess having a concave shape thereon. The third semiconductor chip may include a third bump pattern on a first surface of a third semiconductor substrate. The first semiconductor chip, the second semiconductor chip and the third semiconductor chip may be sequentially stacked. The second bump pattern of the second semiconductor chip may be bonded on the first pad pattern to fill the first pad pattern recess of the first semiconductor chip, and the third bump pattern of the third semiconductor chip may be bonded on the second pad pattern to fill the second pad pattern recess of the second semiconductor chip.

According to example embodiments, there is provided a semiconductor package that may include a first semiconductor chip and a second semiconductor chip. The first semiconductor chip may include a first semiconductor substrate, a through via structure and a pad pattern. The first semiconductor substrate may include a first surface and a second surface opposite to the first surface, and the second surface may include a first semiconductor substrate recess. The through via structure may passing through the first semiconductor substrate from the first surface to a bottom of the first semiconductor substrate recess of the second surface. An upper surface of the through via structure may protrude from the bottom of the first semiconductor substrate recess. The pad pattern may be electrically connected to the upper surface of the through via structure, and the pad pattern may include a first pad pattern recess having a concave shape thereon. The second semiconductor chip may include a bump pattern bonded on an inside of the first pad pattern recess of the pad pattern.

In example embodiments, the height of the gap between the bonded semiconductor chips may be reduced, so that the height of the semiconductor package may be reduced. Further, the bump pattern may be bonded in the first pad pattern recess, so that an electrical short failure between neighboring bump patterns may be decreased.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments;

FIGS. 2 to 13 are cross-sectional views illustrating a method of manufacturing a semiconductor package in accordance with example embodiments;

FIG. 14 is a cross-sectional view illustrating an assembly structure including a semiconductor package in accordance with example embodiments;

FIG. 15 is a cross-sectional view illustrating a semiconductor package in accordance with example embodiments; and FIGS. 16 to 19 are cross-sectional views illustrating a method of manufacturing a semiconductor package in accordance with example embodiments.

DESCRIPTION OF EMBODIMENTS

Figure 1:
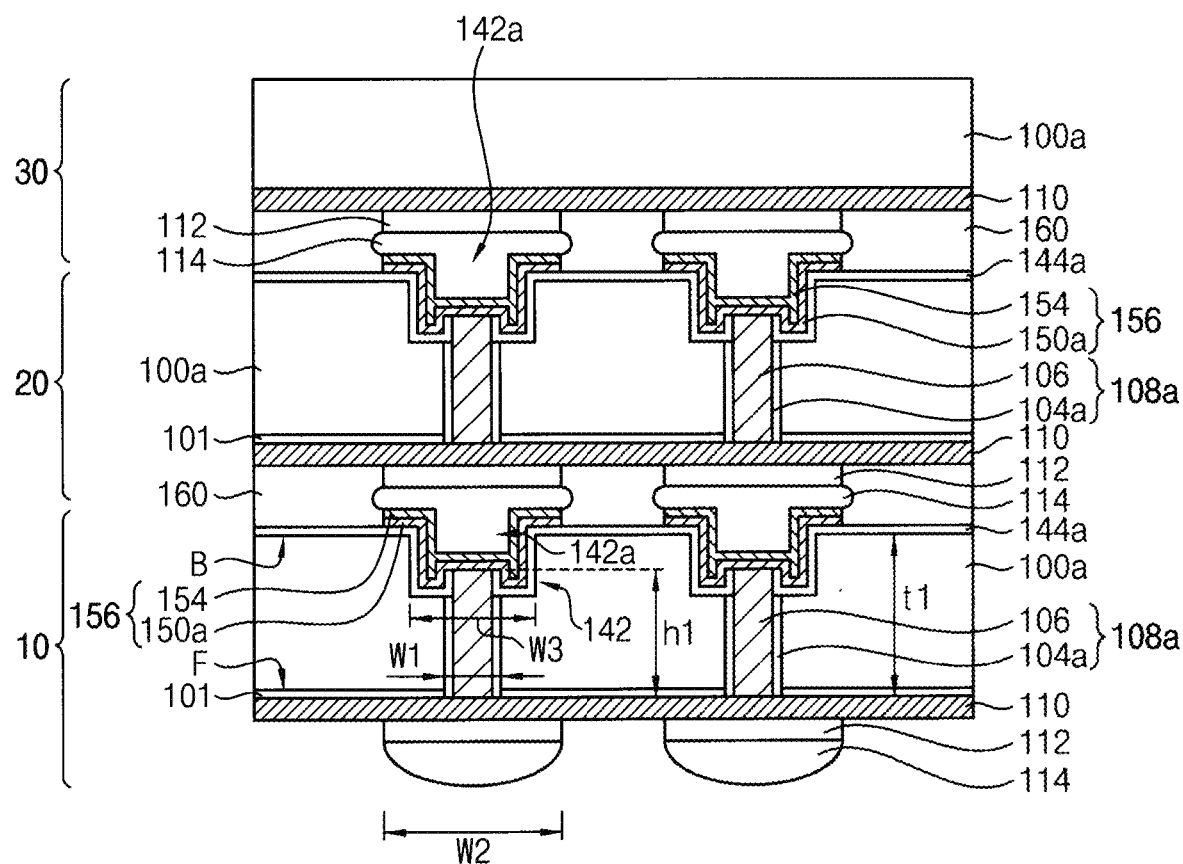
FIGS. 1 to 19 represent non-limiting, example embodiments as described herein.

FIG. 1 is a cross-sectional view illustrating a semiconductor package in accordance with example embodiments.

Referring to FIG. 1, the semiconductor package 198 may have a structure in which a first semiconductor chip 10, a second semiconductor chip 20, and/or a third semiconductor chip 30 may be stacked in a vertical direction and bonded to each other.

In example embodiments, the semiconductor package 198 including three semiconductor chips stacked may be described, but the number of the semiconductor chips included in the semiconductor package 198 may not be limited thereto. That is, the semiconductor package 198 may include two or more semiconductor chips stacked.

Each of the first semiconductor chip 10, the second semiconductor chip 20 and the third semiconductor chip 30 may include an integrated circuit chip that may be formed by semiconductor manufacturing processes. Each of the first semiconductor chip 10, the second semiconductor chip 20, and the third semiconductor chip 30 may include, e.g., a memory chip or a logic chip, etc.

Hereinafter, first, the first semiconductor chip 10 may be described.

The first semiconductor chip 10 may include a through via structure 108a formed in a semiconductor substrate 100a. The semiconductor substrate 100a may have a front surface and a backside surface opposite to the front surface, and the backside surface may be disposed upward. Hereinafter, the front surface of the semiconductor substrate 100a is referred to as a first surface F and the backside surface is referred to as a second surface B.

A first pad pattern 112 and a bump pattern 114 may be formed on the first surface F of the semiconductor substrate 100a. A second pad pattern 156 may be formed on the second surface B of the semiconductor substrate 100a, and the second pad pattern 156 may be electrically connected to the through via structure 108a. A recess 142 may be formed at the second surface B of the semiconductor substrate 100a, and an upper surface of the through via structure 108a may be disposed at an inner portion of the recess 142. In the first semiconductor chip 10, a first lower insulating interlayer 101 and a second lower insulating interlayer 110 may be further formed on the first surface F of the semiconductor substrate 100a.

The semiconductor substrate 100a may include single crystal silicon. Circuit patterns (not shown) may be formed on the first surface F of the semiconductor substrate 100a. The circuit patterns may include, e.g., transistors, capacitors, wiring structures, or the like. The circuit patterns may serve as logic devices or memory devices. The first lower insulating interlayer 101 may cover the circuit patterns.

A sum of thicknesses of the semiconductor substrate 100a and the first lower insulating interlayer 101 may be a first thickness t1.

The recess 142 may be formed by partially removing the second surface B of the semiconductor substrate 100a.

The through via structure 108a may pass through the semiconductor substrate 100a from the surface of the first lower insulating interlayer 101. The upper surface of the through via structure 108a may be lower than the second surface of the semiconductor substrate 100a. The upper surface of the through via structure 108a may be higher than a bottom of the recess 142. Thus, the upper surface of the through via structure 108a may protrude from the bottom of the recess 142.

The through via structure 108a may have a first height h1 less than the first thickness t1. In example embodiments, the first height h1 may be less than a thickness of the semiconductor substrate 100a.

The through via structure 108a may have a first width w1 in a horizontal direction less than the first height h1.

For example, the first height h1 may be in range of about 30 μm to about 50 μm, and the first width w1 may be in range of about 4 μm to about 5 μm. For example, an aspect ratio of the through via structure 108a may be about 6 to 12:1.

The recess 142 may have a third width w3 greater than the first width w1.

The through via structure 108a may include a through via 106 and a first insulation liner pattern 104a. The through via 106 may pass through the semiconductor substrate 100a from a surface of the first lower insulating interlayer 101. The first insulation liner pattern 104a may surround a lower sidewall of the through via 106.

In example embodiments, the first insulation liner pattern 104a may not be formed on an upper sidewall of the through via 106 that may protrude from the bottom of the recess 142.

In example embodiments, the first insulation liner pattern 104a may include silicon oxide and/or silicon nitride. The through vias 106 may include, e.g., copper (Cu), ruthenium (Ru), nickel (Ni), gold (Au), tungsten (W), etc.

An upper surface of the through via 106 may not be coplanar with the second surface B of the semiconductor substrate 100a. That is, the upper surface of the through via 106 may be lower than the second surface B of the semiconductor substrate 100a.

A second insulation liner pattern 144a may be conformally formed on the second surface B of the semiconductor substrate 100a, an inner surface of the recess 142 and the upper sidewall of the through via 106 protruding from the bottom of the recess 142.

The first and second insulation liner patterns 104a and 144a may not be formed on the upper surface of the through via 106.

In example embodiments, the second insulation liner pattern 144a may not completely fill a concave portion between the sidewall of the recess 142 and the upper sidewall of the through via 106. Only the upper surface of the through via 106 may be exposed by the second insulation liner pattern 144a. In example embodiments, the second insulation liner pattern 144a may include silicon oxide and/or silicon nitride.

Internal wirings (not shown) may be formed on the first lower insulating interlayer 101 and the through via structure 108a formed on the first surface F of the semiconductor substrate 100a. The internal wires may include a metal material. The second lower insulating interlayer 110 may be formed on bottoms of the first lower insulating interlayer 101 and the through via structure 108a to cover the internal wirings.

In example embodiments, the internal wirings may include a contact plug and a conductive line. At least one of the internal wirings may be electrically connected to the through via structure 108a.

The first pad pattern 112 may be formed on the bottom of the second lower insulating interlayer 110. The first pad pattern 112 and the through via structure 108a may be faced to each other in a vertical direction. The vertical direction may be a direction perpendicular to the first surface of the semiconductor substrate 100a. The first pad pattern 112 may have a second width w2 in the horizontal direction greater than the first width w1. The second width w2 may be greater than the third width w3. Thus, the first pad pattern 112 may overlap the bottom of the through via structure 108a.

The first pad pattern 112 may include a metal. In example embodiments, the first pad pattern 112 may include, e.g., copper (Cu), ruthenium (Ru), nickel (Ni), gold (Au), tungsten (W) or the like.

The bump pattern 114 may be formed on the first pad pattern 112. In example embodiments, the bump pattern 114 may include a solder ball. The bump pattern 114 may cover a bottom of the first pad pattern 112.

In example embodiments, the bump pattern 114 of the first semiconductor chip 10, which is a lowermost chip, may be exposed.

The second pad pattern 156 may contact the upper surface of the through via 106, and thus the second pad pattern 156 may be electrically connected to the through via 106. The second pad pattern 156 may have a barrier pattern (not shown), a seed pattern 150a and a metal pattern 154 sequentially stacked. The barrier pattern, the seed pattern 150a and the metal pattern 154 may be conformally formed on a surface of the second insulation liner pattern 144a positioned at the inner portion of the recess 142, and the upper surface of the through via 106. Further, a portion of the second pad pattern 156 may be formed on the second insulation liner pattern 144a positioned on the second surface of the semiconductor substrate 100a.

The second pad pattern 156 may be formed at the concave portion between the sidewall of the recess 142 and the upper sidewall of the through via 106. In example embodiments, the second pad pattern 156 may fill the concave portion between the sidewall of the recess 142 and the upper sidewall of the through via 106. In some example embodiments, the second pad pattern 156 may be conformally formed on a surface of the concave portion between the sidewall of the recess 142 and the top sidewall of the through via 106. Thus, the second pad pattern 156 may have a profile the same or substantially the same as a profile the surface of the concave portion. In some embodiments, at least a portion of the second pad pattern 156 may be positioned lower than the upper surface of the through via structure 108a.

An upper surface of the second pad pattern 156 may have a concave shape. The second pad pattern may include a first recess 142a. The first recess 142a may be an inner space defined by a concave upper surface of the second pad pattern 156.

In example embodiments, the barrier pattern may be, e.g., titanium (Ti), titanium nitride (TiN), titanium tungsten (TiW), tantalum (Ta), tantalum nitride (TaN), tungsten (W), tungsten nitride (WN) or the like. The seed pattern 150a may include, e.g., copper (Cu), ruthenium (Ru), nickel (Ni), gold (Au), and tungsten (W). The metal pattern 154 may include, for example, nickel (Ni), gold (Au), or the like.

A volume of the first recess 142a on the metal pattern 154 may be less than a volume of the bump pattern 114.

In example embodiments, the volume of the first recess 142a may be about 20% to about 95% of the volume of the bump pattern 114. In example embodiments, the volume of the first recess 142a may be about 50% to 95% of the volume of the bump pattern 114.

The second semiconductor chip 20 may be stacked on the first semiconductor chip 10.

In example embodiments, the second semiconductor chip 20 may be the same or substantially the same as the first semiconductor chip 10. In some example embodiments, the second semiconductor chip 20 may include a semiconductor device different from a semiconductor device included in the first semiconductor chip 10.

In example embodiments, the second semiconductor chip 20 may have a structure the same or substantially the same as the structure of the first semiconductor chip. The second semiconductor chip 20 may include the first pad pattern 112 and the bump pattern 114 formed on the first surface F of the semiconductor substrate 100a. The second semiconductor chip 20 may include the second pad pattern 156 formed on the second surface B of the semiconductor substrate 100a. The second pad pattern 156 may contact the through via 106, and may have a concave upper surface.

The second pad pattern 156 of the first semiconductor chip 10 and the bump pattern 114 of the second semiconductor chip 20 may be bonded to each other.

The bump pattern 114 of the second semiconductor chip 20 may sufficiently fill the first recess 142a on the second pad pattern 156 of the first semiconductor chip 10. The bump pattern 114 of the second semiconductor chip 20 includes a first portion positioned in the first recess 142a and a second portion positioned above the first recess 142a. In example embodiments, a thickness of the first portion may be greater than a thickness of the second portion.

A portion of the bump pattern 114 may be formed at an inner portion the first recess 142a on the second pad pattern 156. Thus, a height from the second surface B of the semiconductor substrate 100a to an upper surface of the bump pattern 114 may be decreased.

A non-conductive film 160 (NCF) may be formed between the first semiconductor chip 10 and the second semiconductor chip 20. That is, the non-conductive film 160 may be formed on both sides of the bump pattern 114, and the non-conductive film 160 may fill a gap between the second insulation liner pattern 144a of the first semiconductor chip 10 and the second lower insulating interlayer 110 of the second semiconductor chip 20.

As described above, the bump pattern 114 may be formed in the first recess 142a, so that a gap between the bonded first and second semiconductor chips 10 and 20 may be decreased. Thus, a height of the non-conductive film 160 filling the gap may be decreased.

The third semiconductor chip 30, which is the uppermost semiconductor chip, may be stacked on the second semiconductor chip 20.

The third semiconductor chip 30 may be the same or substantially the same as the second semiconductor chip 20, except that the through silicon via structure may not be included therein. The third semiconductor chip 30 may include the first pad pattern 112 and the bump pattern 114 on the first surface F of the semiconductor substrate 100a. However, the through via structure and the second pad pattern may not be formed on the second surface B of the semiconductor substrate 100a.

The bump pattern 114 of the third semiconductor chip 30 and the second pad pattern 156 of the second semiconductor chip 20 may be bonded to each other. The non-conductive film 160 may be formed on the both sides of the bump pattern 114, and may fill a gap between the second semiconductor chip 20 and the third semiconductor chip 30.

As described above, a portion of the bump pattern 114 may be formed at an inner portion the first recess 142a on the second pad pattern 156. Thus, the gap between the second semiconductor chip 20 and the third semiconductor chip 30 may be decreased.

As a height of a gap between bonded semiconductor chips is decreased, a height of a semiconductor package may be decreased. Further, the number of stacked semiconductor chips included in a semiconductor package having the same height may be increased.

The bump pattern 114 may have an isolated shape in the first recess 142a. Thus, an electrical short failure between neighboring bump patterns may be decreased.

FIGS. 2 to 13 are cross-sectional views illustrating a method of manufacturing a semiconductor package in accordance with example embodiments.

Figure 2:
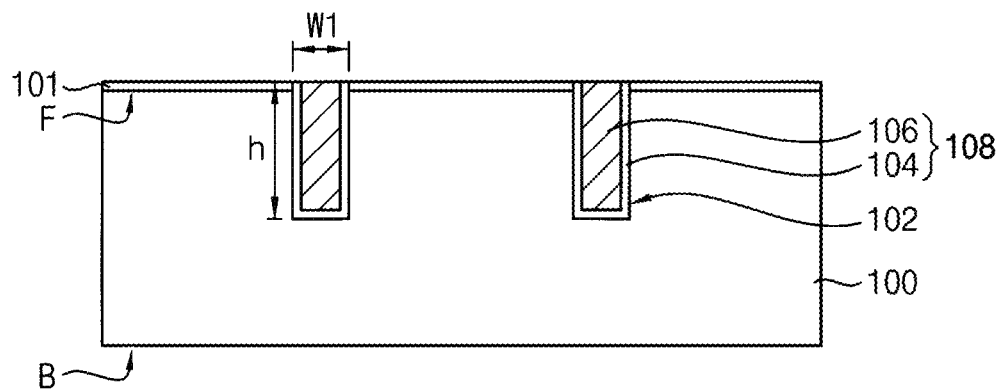

Referring to FIG. 2, circuit patterns (not shown) may be formed on a preliminary semiconductor substrate 100 by performing a front end of line (FEOL) process for manufacturing a semiconductor device. A first lower insulating interlayer 101 may be formed to cover the circuit patterns.

The preliminary semiconductor substrate 100 may include a silicon substrate. Hereinafter, a surface of a substrate on which the FEOL process is performed is referred to as a first surface F, and an opposite surface of the first surface F is referred to as a second surface B.

A preliminary through via structure 108 may be formed to extend from the first lower insulating interlayer 101 to an inner portion of the preliminary semiconductor substrate 100. The preliminary through via structure 108 may include a through via 106 and a first insulation liner 104 surrounding sidewalls and a bottom of the through via 106.

In example embodiments, the preliminary through via structure 108 may have a height h in the vertical direction less than a thickness of a semiconductor substrate of a final chip. In addition, the preliminary through via structure 108 may have a first width w1 in the horizontal direction less than the height h.

Hereinafter, processes for forming the preliminary through via structure 108 may be described.

First, an etch mask pattern (not shown) may be formed on the first lower insulating interlayer 101, and the first lower insulating interlayer 101 and the preliminary semiconductor substrate 100 may be etched using the etch mask pattern to form the via hole 102. A bottom of the via hole 102 may be disposed at the inner portion of the preliminary semiconductor substrate 100. Then, the etching mask pattern may be removed.

An insulation liner layer may be conformally formed on surfaces of the first lower insulating interlayer 101 and the via hole 102. A conductive layer may be formed on the insulation liner layer to fill the via hole 102.

The insulation liner layer may include silicon oxide and/or silicon nitride. The conductive layer may include, e.g., copper (Cu), ruthenium (Ru), nickel (Ni), gold (Au), tungsten (W) or the like. In example embodiments, the conductive layer may include copper layer. That is, a copper seed layer may be formed on the insulation liner layer, and an electroplating process using the copper seed layer may be performed to form the copper layer.

Thereafter, the conductive layer and the insulation liner layer may be planarized until an upper surface of the first lower insulating interlayer 101 may be exposed to form the preliminary through via structure 108 in the via hole 102. The preliminary through via structure 108 may include the through via 106 and the first insulation liner 104. The planarization process may include a chemical mechanical polishing process (CMP) and/or an etch back process.

Figure 3:
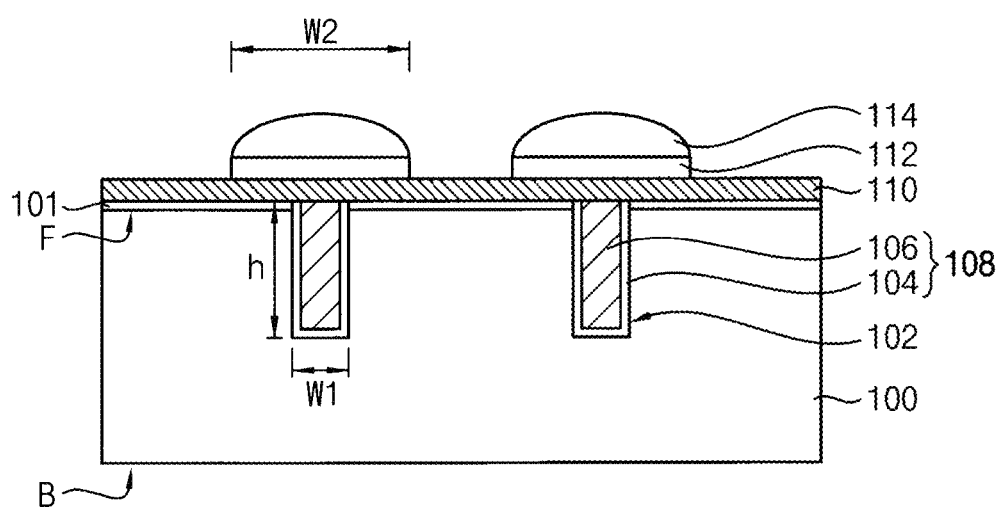

Referring to FIG. 3, internal wirings (not shown) are formed by performing a wiring process on the first lower insulating interlayer 101 and the preliminary through via structure 108. The wiring process is commonly referred to as a back end of line (BEOL) process. A second lower insulating interlayer 110 may be formed on the first lower insulating interlayer 101 and the preliminary through via structure 108 to cover the internal wirings. At least one of the internal wirings may be electrically connected to the preliminary through via structure 108.

A first pad pattern 112 may be formed on the second lower insulating interlayer 110. The first pad pattern 112 may be formed to face the preliminary through via structure 108 in the vertical direction. The first pad pattern 112 may have a second width w2 in the horizontal direction greater than the first width w1. Thus, the first pad pattern 112 may cover the preliminary through via structure 108.

The first pad pattern 112 may include a metal. In example embodiments, a seed layer may be formed on a portion for forming the first pad pattern 112 and an electroplating process may be performed using the seed layer to form the first pad pattern 112. For example, the first pad pattern 112 may include nickel, gold, or the like.

A bump pattern 114 may be formed on the first pad pattern 112. In example embodiments, the bump pattern 114 may include a solder ball. The bump pattern 114 may cover an upper surface of the first pad pattern 112. Therefore, a lower width of the bump pattern 114 contacting the first pad pattern 112 may be the same or substantially the same as the second width w2.

In FIGS. 4 to 13, the second surface B of the preliminary semiconductor substrate 100 may be upward.

Hereinafter, the second surface B of the preliminary semiconductor substrate or the semiconductor substrate is referred to as an upper surface, and the first surface F of the preliminary semiconductor substrate or the semiconductor substrate is referred to as a lower surface.

Figure 4:
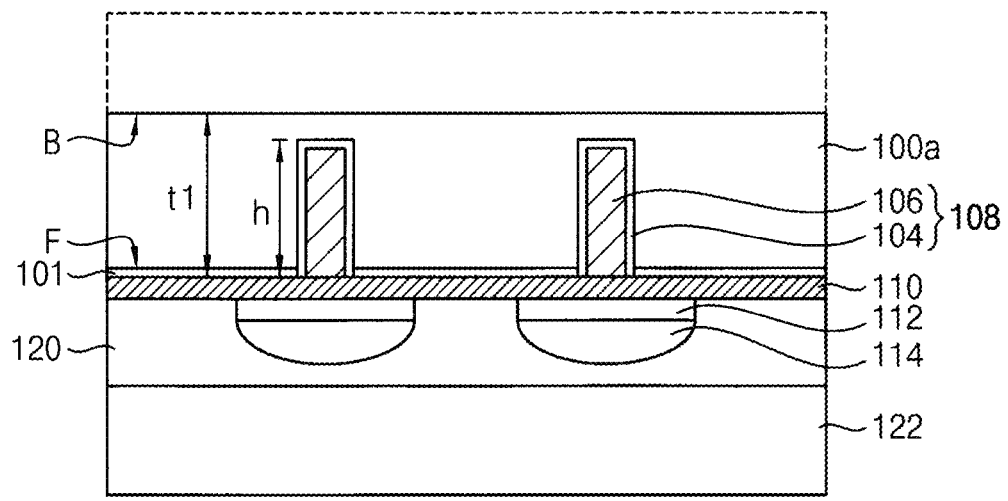

Referring to FIG. 4, a support layer 120 may be formed to cover the second lower insulating interlayer 110 and the bump pattern 114. The support layer 120 may protect structures formed on the first surface F of the preliminary semiconductor substrate 100 during subsequent processes.

A carrier substrate 122 may be attached onto the support layer 120. The carrier substrate 122 may be formed to easily handle the preliminary semiconductor substrate 100, during subsequent processes.

The second surface B of the preliminary semiconductor substrate may be partially removed to form a semiconductor substrate 100a having reduced thickness. In some embodiments, an upper surface of the preliminary through via structure 108 may not be exposed by the second surface B of the semiconductor substrate 100a. A sum of thicknesses of the semiconductor substrate 100a and the first lower insulating interlayer 101 may be a first thickness t1 greater than the height h of the preliminary through via structure 108.

In example embodiments, the removing process of the second surface B of the preliminary semiconductor substrate 100 may include a grinding process and/or an etch back.

As described above, after the removing process of the second surface B of the preliminary semiconductor substrate 100, the preliminary through via structure 108 may not be exposed. Therefore, the preliminary through via structure 108 may have a lower height than in a general case in which the preliminary through via structure 108 is exposed by the second surface of the semiconductor substrate. Therefore, an aspect ratio of the preliminary through via structure 108 may be reduced, and the preliminary through via structure 108 may be easily formed.

Figure 5:
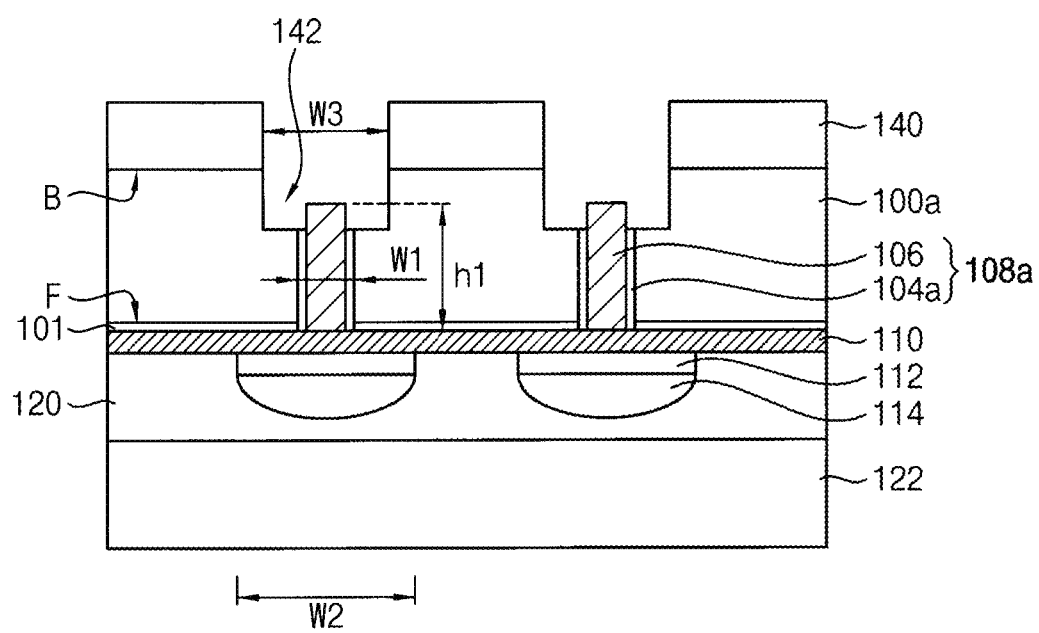

Referring to FIG. 5, a first etching mask 140 may be formed on the second surface B of the semiconductor substrate 100a. The first etching mask 140 may include a photoresist pattern.

The first etching mask 140 may include a first opening at a portion facing the upper surface of the preliminary through via structure 108. In example embodiments, a width of the first opening may have a third width w3 that may be greater than the first width w1 and less than the second width w2.

The semiconductor substrate 100a may be partially etched by a determined thickness using the first etching mask 140 to form a recess 142 on the second surface of the semiconductor substrate 100a. Therefore, the recess 142 may have the third width w3. In the etching process, the first insulation liner 104 exposed by the recess 142 may be etched together to form a first insulation liner pattern 104a.

As the first insulation liner 104 on the surface of the through via 106 is partially etched, at least an upper surface of the through via 106 may be exposed. A through via structure 108a including the through via 106 and the first insulation liner pattern 104a may be formed by the etching process. The through via structure 108a may have a first height h1 less than the first thickness t1.

A bottom of the recess 142 may be lower than an upper surface of the through via structure 108a. Thus, the upper surface of the through via structure 108a may protrude from the bottom of the recess 142.

The semiconductor substrate 100a may be etched such that the upper surface of the through via structure 108a may protrude from the bottom of the recess 142. Thus, even if a variation of the etching process occurs, the upper surface of through via structures 108a may be sufficiently exposed by the recess 142 of the semiconductor substrate 100a.

In example embodiments, the upper surface and an upper sidewall of the through via 106 may be exposed by the recess 142. In some example embodiments, only the upper surface of the through via 106 may be exposed by the recess 142, and the upper sidewall of the through via may not be exposed by the recess 142.

Thereafter, the first etching mask 140 may be removed.

Figure 6:
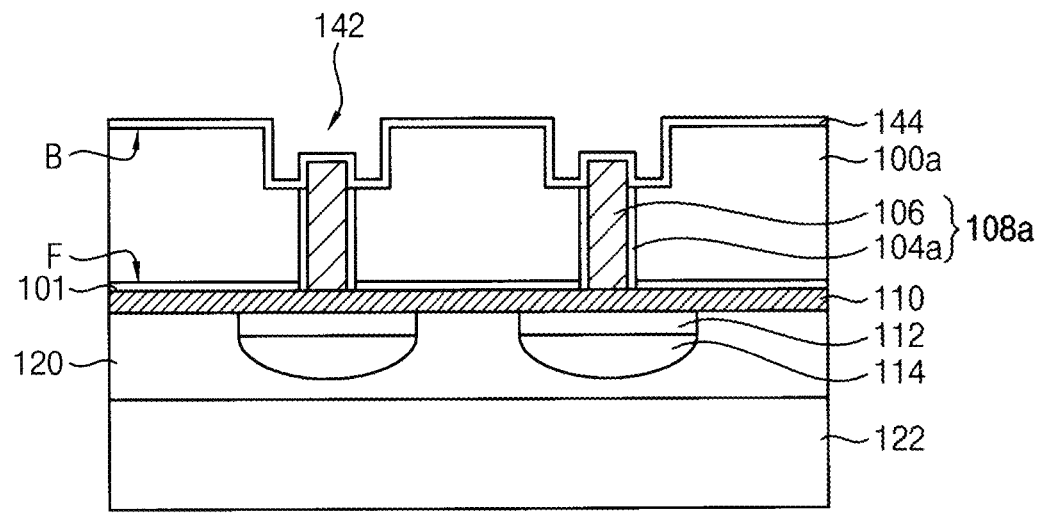

Referring to FIG. 6, a second insulation liner 144 may be conformally formed on the second surface B of the semiconductor substrate 100a, an inner surface of the recess 142 and an exposed surface of the through via structure 108a.

The second insulation liner 144 may not completely fill a concave portion between a sidewall of the recess 142 and an upper sidewall of the through via 106. In example embodiments, the second insulation liner 144 may be formed to have a thickness less than ½ of a width between the sidewall of the recess 142 and the upper sidewall of the through via 106.

Figure 7:
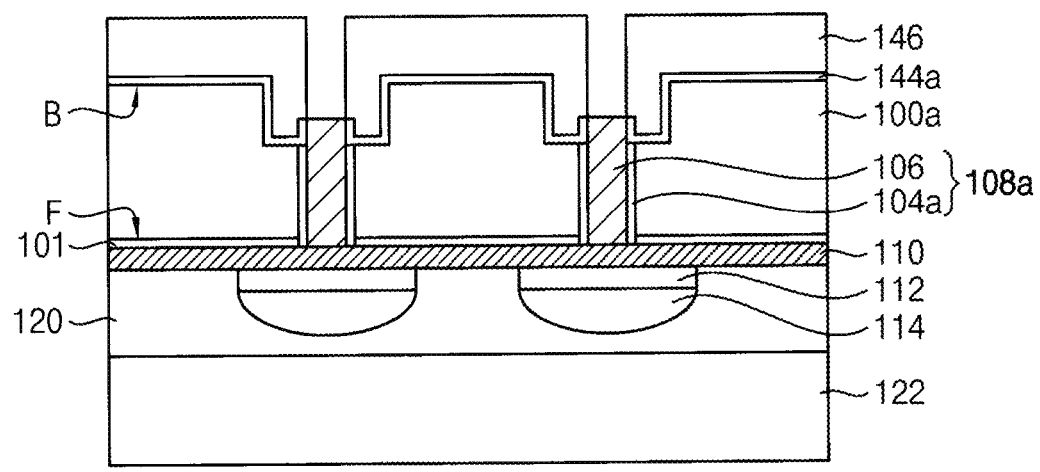

Referring to FIG. 7, a second etching mask 146 is formed on the second insulation liner 144. The second etching mask 146 may include a photoresist pattern. The second etching mask 146 may include a second opening exposing a portion of the upper surface of the through via 106.

The second insulation liner 144 may be etched using the second etching mask 146 to form a second insulation liner pattern 144a. Thus, the upper surface of the through via 106 may be exposed by the second insulation liner pattern 144a.

Figure 8:
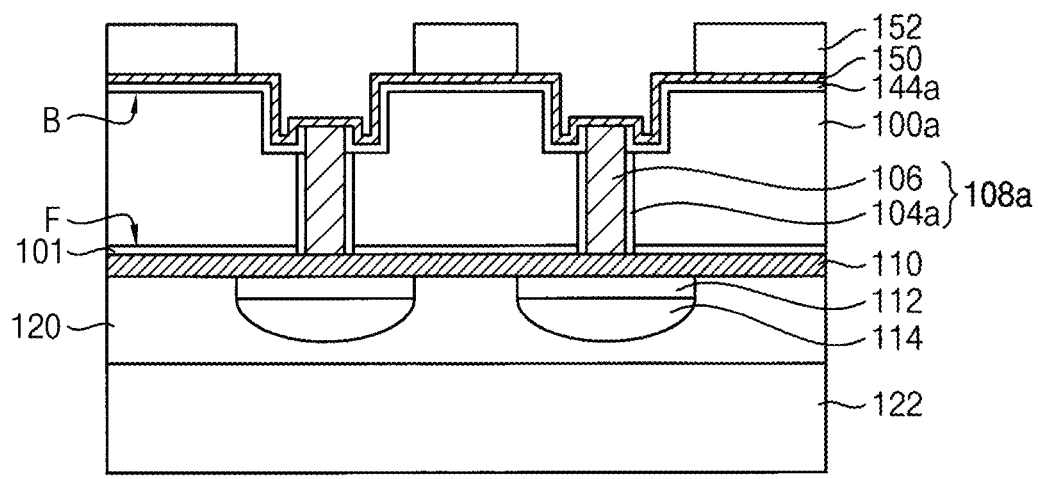

Referring to FIG. 8, a barrier layer and a seed layer 150 may be conformally formed on surfaces of the second insulation liner pattern 144a and the through via 106. The seed layer 150 may be formed on the barrier layer. In FIG. 8, only the seed layer 150 is illustrated without the barrier layer in order to avoid the complexity of the drawing.

The barrier layer may include, e.g., titanium (Ti), titanium nitride (TiN), titanium tungsten (TiW), tantalum (Ta), tantalum nitride (TaN), tungsten (W), tungsten nitride (WN), or the like. The seed layer 150 may include, e.g., copper (Cu), ruthenium (Ru), nickel (Ni), gold (Au), tungsten (W) or the like. In example embodiments, the barrier layer and the seed layer 150 may be formed by a physical vapor deposition process.

A mask pattern 152 may be formed on the seed layer 150. The mask pattern 152 may include a photoresist pattern. The mask pattern 152 may define a portion for forming a metal pattern in a subsequent electroplating process. Thus, the mask pattern 152 may include a third opening exposing a portion for forming a second pad pattern. The seed layer 150 formed on the inner surface of the recess 142 and on the semiconductor substrate 100a adjacent to the recess 142 may be exposed by the third opening.

Figure 9:
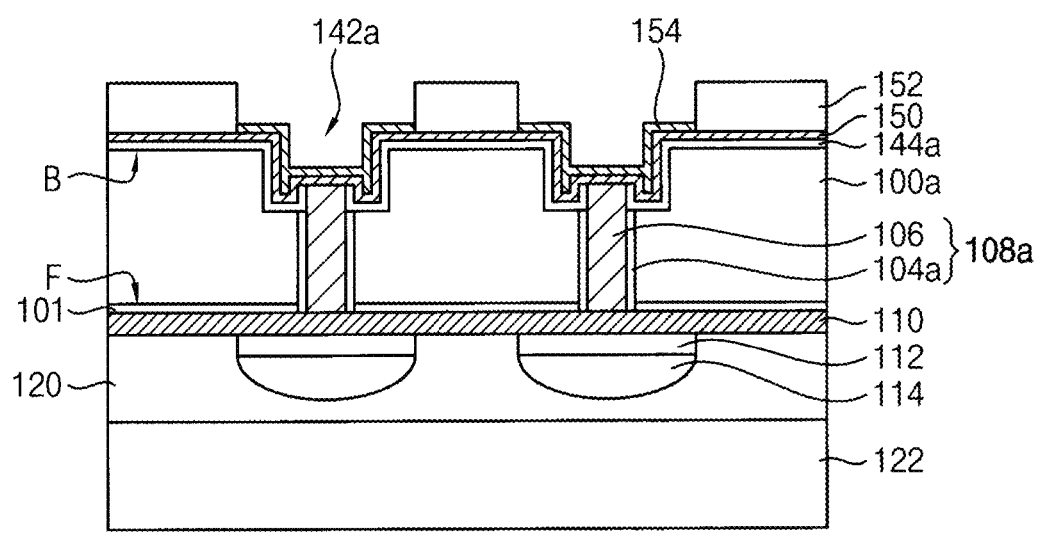

Referring to FIG. 9, a metal pattern 154 may be formed on the seed layer 150 exposed by the third opening.

The metal pattern 154 may be formed by an electroplating process using the seed layer 150 as a seed. The metal pattern 154 may include, e.g., nickel (Ni), gold (Au), or the like. The metal pattern 154 may be conformally formed on an exposed seed layer 150.

As the metal pattern 154 is formed along a profile of a lower portion of recess 142, an upper surface of the metal pattern 154 may have a concave shape. That is, a first recess 142a may be formed on the metal pattern 154.

In example embodiments, the metal pattern 154 may sufficiently fill the concave portion between the sidewall of the recess 142 and the upper sidewall of the through via 106. In some example embodiments, the metal pattern 154 may be conformally formed along a profile of the concave portion between the sidewall of the recess 142 and the upper sidewall of the through via 106, so that the metal pattern 154 may not completely fill the concave portion.

A volume of the first recess 142a on the metal pattern 154 may be less than a volume of the bump pattern 114.

In subsequent processes, a bump pattern 114 of a second semiconductor chip may contact on an inside of the first recess 142*a*, so that the first and second semiconductor chips may be bonded to each other. In some embodiments, as the volume of the first recess 142*a* becomes larger to be similar to the volume of the bump pattern 114, a distance (or a gap) between the bonded first and second semiconductor chips may be reduced. However, when the volume of the first recess 142*a* is greater than the volume of the bump pattern 114, the bump pattern 114 may not completely fill the first recess 142*a*. In some embodiments, the first and second semiconductor chips may not be normally bonded to each other.

When the volume of the first recess 142*a* is less than or equal to 20% of the volume of the bump pattern 114, the distance between the bonded first and second semiconductor chips may not be sufficiently reduced. When the volume of the first recess 142*a* is greater than or equal to 95% of the volume of the bump pattern 114, the first and second semiconductor chips may not be normally bonded to each other. In example embodiments, the volume of the first recess 142*a* may be about 20% to about 95% of the volume of the bump pattern 114. In example embodiments, the volume of the first recess 142*a* may be about 50% to about 95% of the volume of the bump pattern 114.

Thereafter, the mask pattern 152 may be removed. The seed layer 150 may be exposed at a removed portion of the mask pattern 152.

Figure 10:
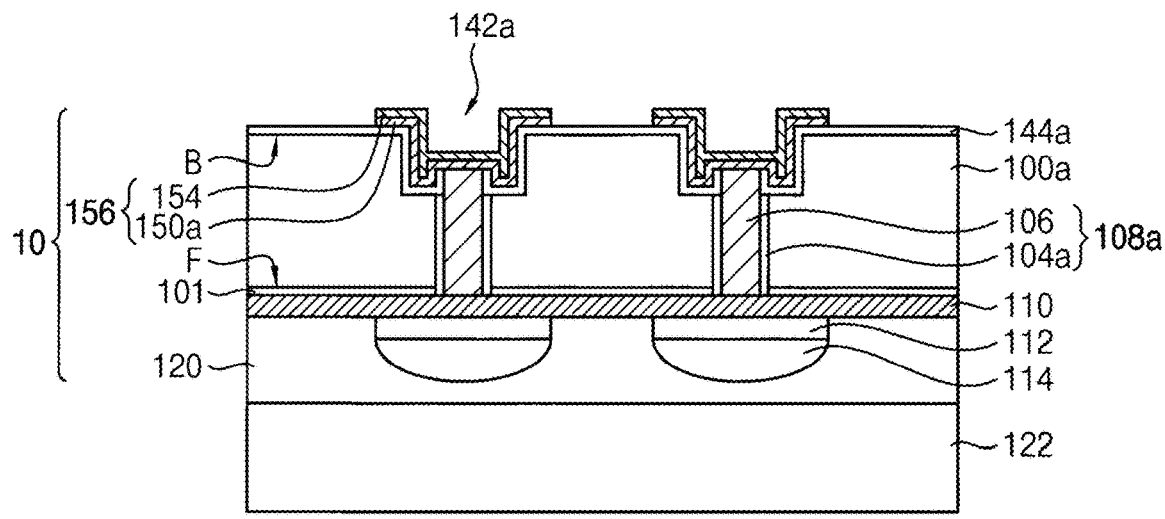

Referring to FIG. 10, the barrier layer and seed layer 150 may be etched using the metal pattern 154 as an etching mask. Thus, a barrier pattern (not shown) and a seed pattern 150*a* may be formed under the metal pattern 154.

A second pad pattern 156 including the barrier pattern, the seed pattern 150*a* and the metal pattern 154 sequentially stacked may be formed by the processes. The second pad pattern 156 may be formed on the second insulation liner pattern 144*a* in the recess 142, the upper surface of the through via 106, and a portion of the second insulation liner pattern 144*a* on the second surface of the semiconductor substrate 100*a*. The second pad pattern 156 may contact the upper surface of the through via 106, and the second pad pattern 156 may be electrically connected to the through via 106.

As described above, the first semiconductor chip 10 including a semiconductor device may be formed. The first semiconductor chip 10 may include the first pad pattern 112 and the bump pattern 114 on the first surface F of the semiconductor substrate 100*a*, and may include the second pad pattern 156 on the surface B of the semiconductor substrate 100*a*. The second pad pattern 156 may contact the through via 106, and the upper surface of the second pad pattern 156 may have a concave shape.

The semiconductor package may be formed by stacking and bonding semiconductor chips in the vertical direction. Thus, the semiconductor chips included in the semiconductor package may be manufactured by processes the same or substantially the same as those described with reference to FIGS. 2 to 10. The semiconductor chips may include, e.g., memory chips or logic chips.

Hereinafter, a method of forming the semiconductor package by bonding and stacking three semiconductor chips in the vertical direction may be described.

Figure 11:
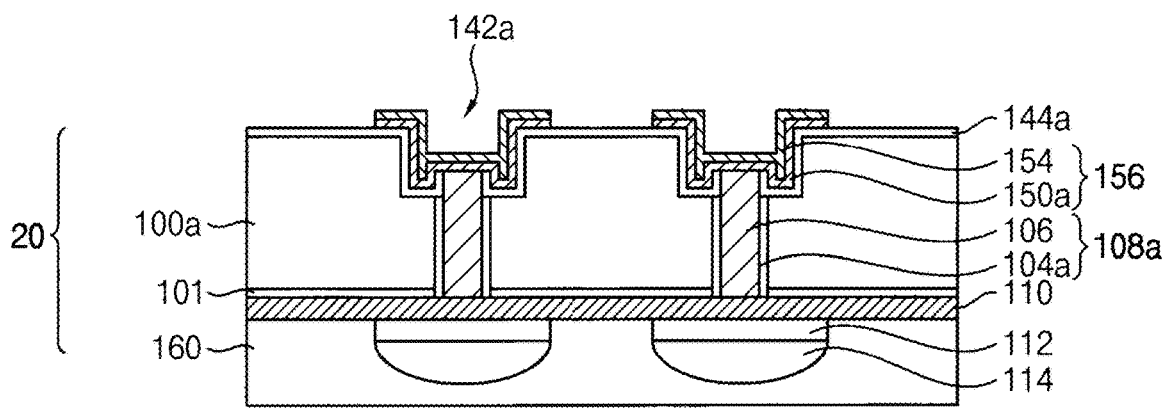
Figure 11:
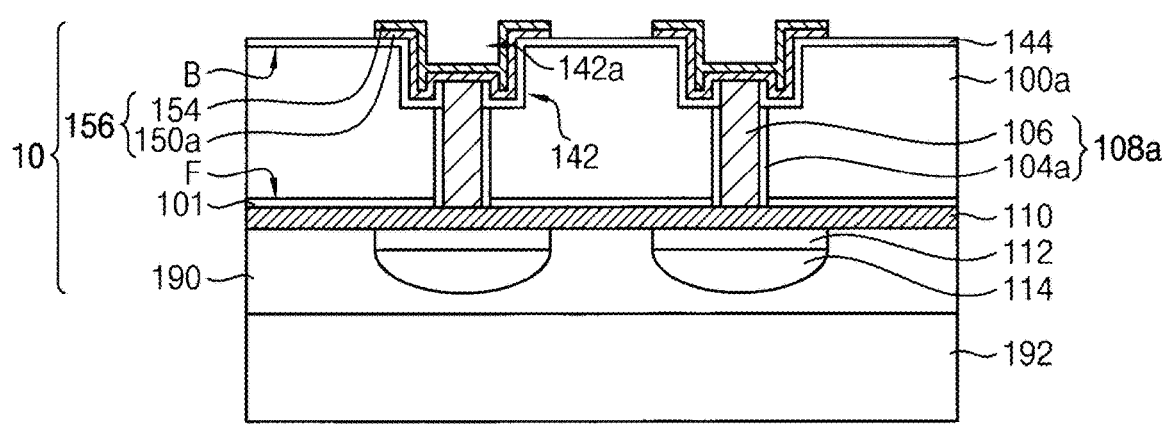

Referring to FIG. 11, the second semiconductor chip 20 may be aligned on the first semiconductor chip 10.

In example embodiments, the second semiconductor chip 20 may have a structure the same or substantially the same as a structure of the first semiconductor chip 10. That is, the second semiconductor chip 20 may include the first pad pattern 112 and the bump pattern 114 on the first surface F of the semiconductor substrate 100*a*, and may include the second pad pattern 156 on the second surface B of the semiconductor substrate 100*a*. The second pad pattern 156 may contact the through via 106.

In example embodiments, each of the first semiconductor chip 10 and the second semiconductor chip 20 may be an individual chip that a plurality of chips formed on the semiconductor wafer may be separated from each other by a sawing process. Before performing the sawing process, the carrier substrate 122 may be removed, and the support layer 120 may also be removed.

In example embodiments, a passivation layer 190 may be formed on a bottom of the first semiconductor chip 10, which is a lowermost semiconductor chip. A bottom of the passivation layer 190 may contact a support substrate 192, so that the first semiconductor chip 10 may be fixed on the support substrate 192.

A non-conductive film 160 (NCF) covering the bump pattern 114 may be formed on the second lower insulating interlayer 110 of the second semiconductor chip 20.

The non-conductive film 160 may be an adhesive layer for bonding the first and second semiconductor chips 10 and 20 to each other using the bump pattern 114. Further, the non-conductive film 160 may serve as an underfill material between the first and second semiconductor chips 10 and 20. Therefore, the non-conductive film 160 may have a thickness so as to be sufficiently underfilled between the first and second semiconductor chips 10 and 20 in subsequent processes.

Figure 12:
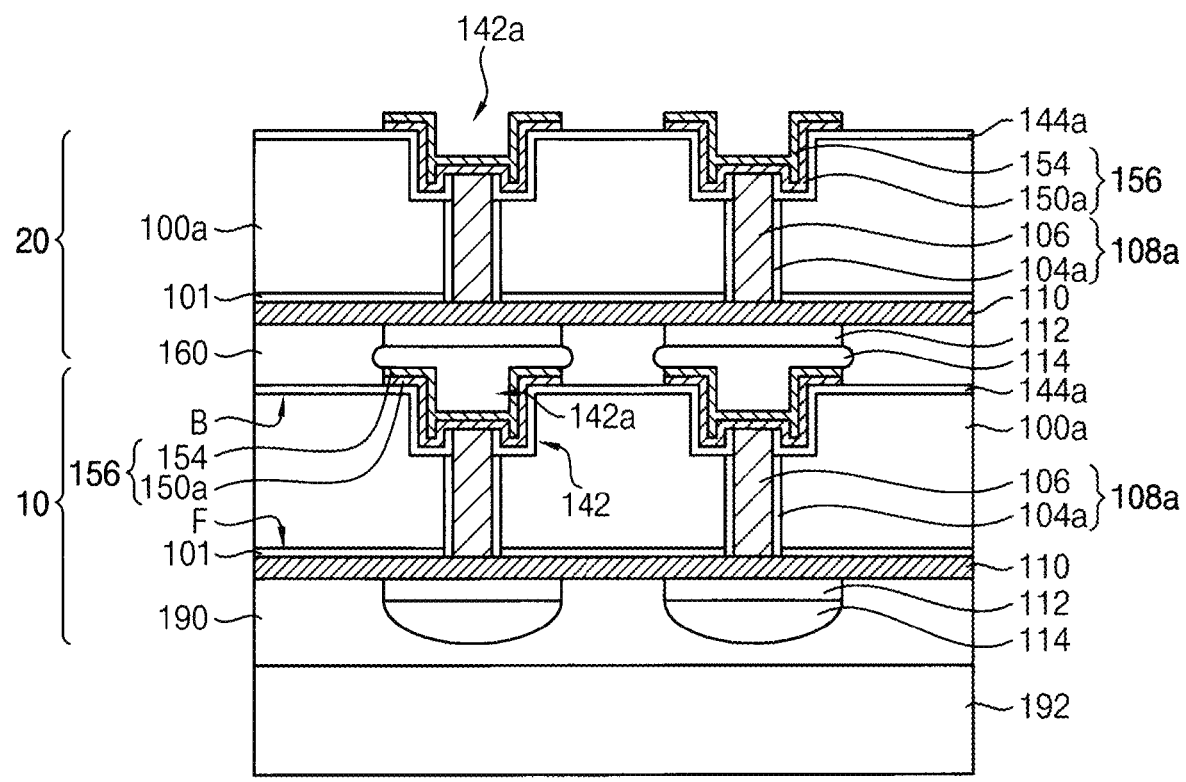

Referring to FIG. 12, the second pad pattern 156 of the first semiconductor chip 10 and the bump pattern 114 of the second semiconductor chip 20 may be bonded to each other.

In example embodiments, the first and second semiconductor chips 10 and 20 may be bonded using a thermal compression non conductive paste (TCNCP) process.

That is, the second pad pattern 156 of the first semiconductor chip 10 and the bump pattern 114 of the second semiconductor chip 20 may contact to each other, and the first and second semiconductor chips 10 and 20 may be pressed to each other. In some embodiments, the non-conductive film 160 having fluidity may be pushed to both sides of the bump pattern 114. The bump pattern 114 of the second semiconductor chip 20 may be sufficiently filled in the first recess 142*a* on the second pad pattern 156, and thus the first and second semiconductor chips 10 and 20 may be bonded to each other. In some embodiments, a portion of the bump pattern 114 may be formed on an inlet portion of the first recess 142*a*. That is, the bump pattern 114 of the second semiconductor chip may include a first portion positioned at an inner portion of the first recess 142*a* and a second portion positioned above the first recess.

The portion of the bump pattern 114 may be disposed in the first recess 142*a* on the second pad pattern 156. Thus, a height from the second surface of the semiconductor substrate 100*a* to the upper surface of the bump pattern 114 may be reduced.

As described above, as the portion of the bump pattern 114 is formed in the first recess 142*a*, a gap between the bonded first and second semiconductor chips 10 and 20 may be reduced. Further, a height of the non-conductive film 160 formed in the gap may be reduced. Therefore, a height of the bonded first and second semiconductor chips 10 and 20 may be reduced.

Although not shown, individual semiconductor chips may be additionally stacked on the second pad pattern 156 of the second semiconductor chip 20 in the same manner. In example embodiments, the individual semiconductor chips may be the same or substantially the same as the second semiconductor chip 20. In some example embodiments, each of the individual semiconductor chips may include a semiconductor device different from a semiconductor device included in the second semiconductor chip 20.

Figure 13:
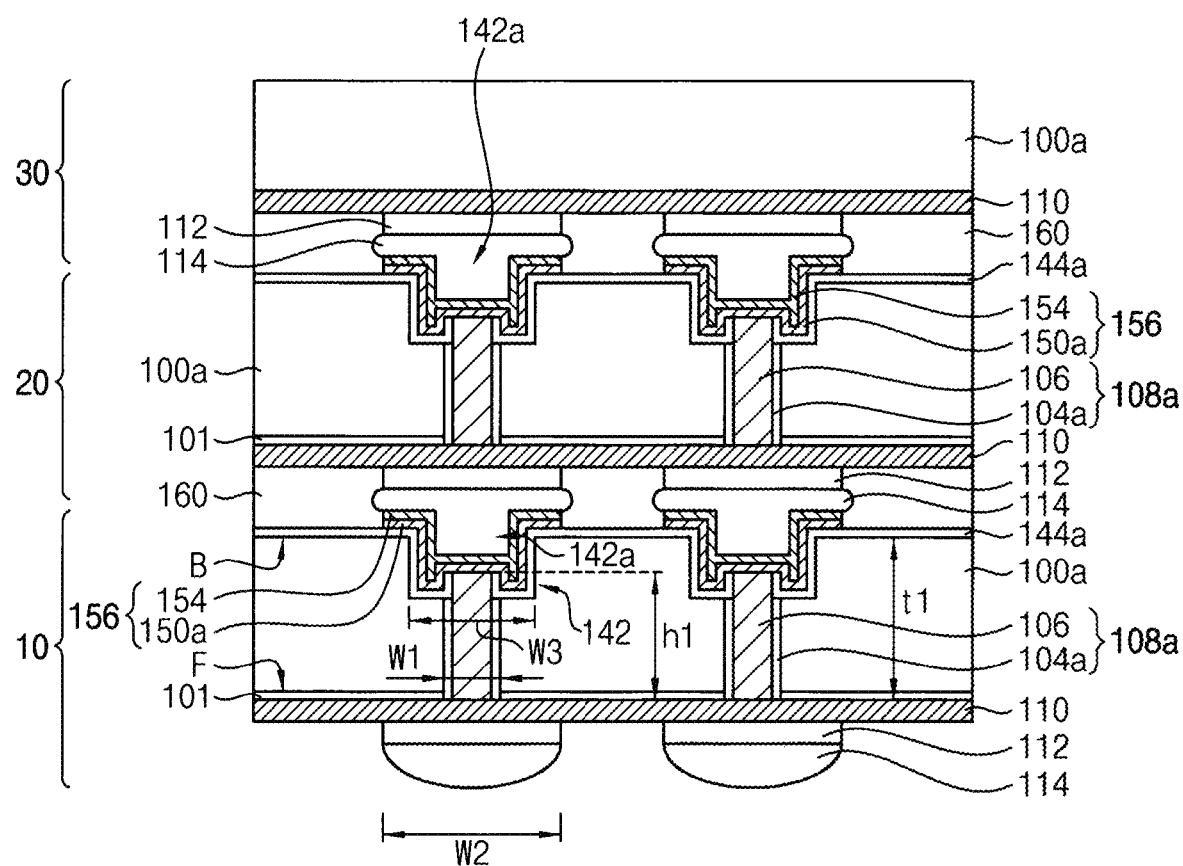

Referring to FIG. 13, a third semiconductor chip 30, which is an uppermost semiconductor chip, may be stacked on the second semiconductor chip 20.

The third semiconductor chip 30 may have a structure the same or substantially the same as a structure of the second semiconductor chip 20, except that the through silicon via structure is not included. That is, the third semiconductor chip 30 may include the first pad pattern 112 and the bump pattern 114 on the first surface F of the semiconductor substrate 100*a*. However, the through via structure and the second pad pattern may not be formed on the second surface B of the semiconductor substrate 100*a*.

In example embodiments, the third semiconductor chip 30 may be an individual chip that a plurality of chips formed on the semiconductor wafer may be separated from each other by a sawing process.

Thereafter, the bump pattern 114 of the third semiconductor chip 30 and the second pad pattern 156 of the second semiconductor chip 20 may be bonded to each other, in the same manner as described with reference to FIG. 12.

The passivation layer 190 and the support substrate 192 on the first semiconductor chip 10 may be removed. Therefore, the bump pattern 114 of the first semiconductor chip 10 may be exposed.

Although not shown, the bump pattern 114 of the first semiconductor chip 10 may be bonded on, e.g., a PCB substrate.

As described above, the semiconductor package including the plurality of semiconductor chips stacked may be manufactured. Height of the semiconductor package may be reduced. Further, as the bump pattern is formed in the first recess, electrical short failure between neighboring bump patterns may be decreased.

Figure 14:
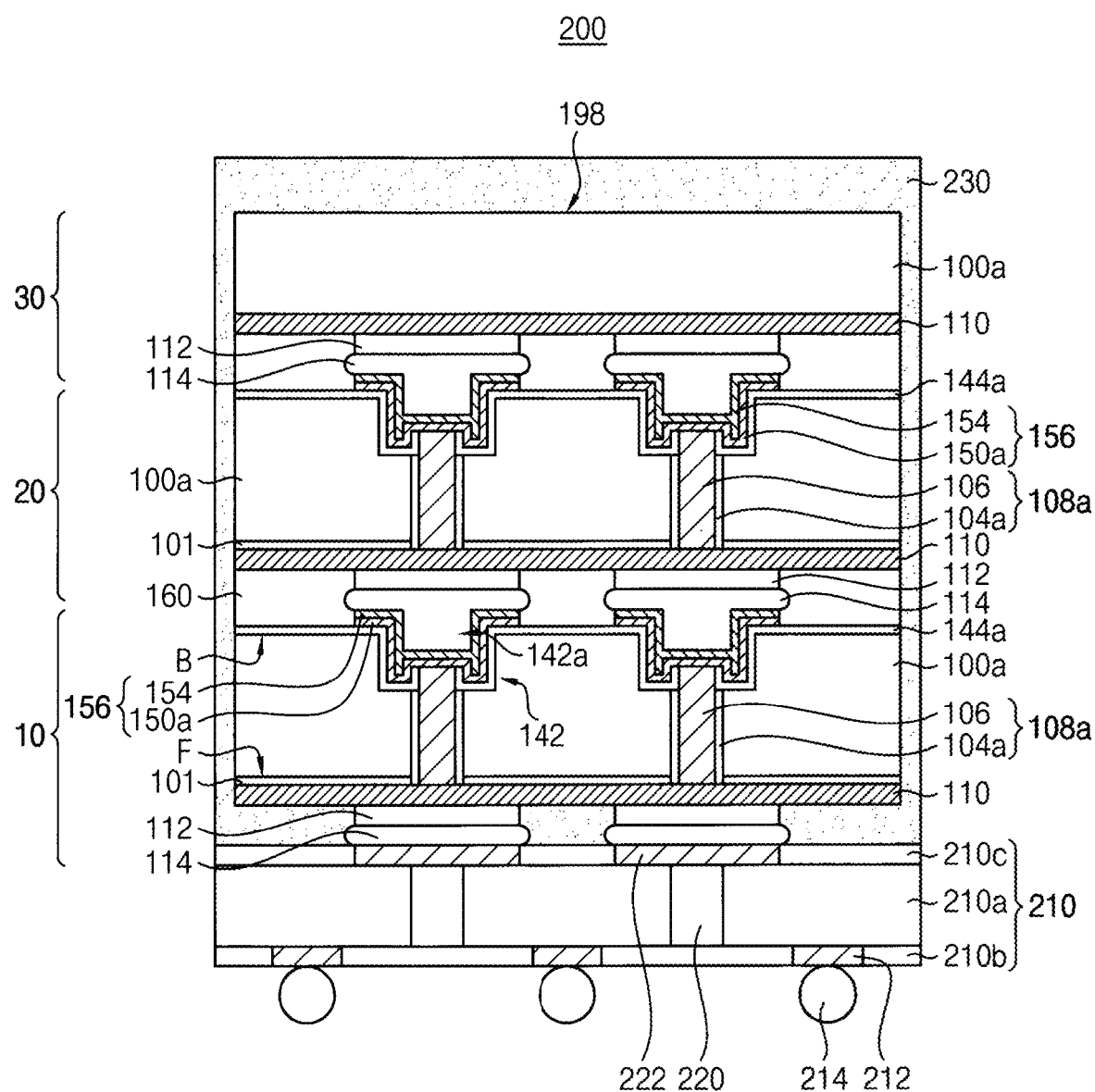

FIG. 14 is a cross-sectional view illustrating an assembly structure including a semiconductor package in accordance with example embodiments.

The assembly structure shown in FIG. 14 may include the semiconductor package shown in FIG. 1 therein.

Referring to FIG. 14, the assembly structure 200 may include a package substrate 210, a semiconductor package 198, and/or a mold layer 230.

The package substrate 210 may include, e.g., a printed circuit board (PCB) having a circuit pattern formed on a surface of a core 210*a* including a reinforced glass fiber or epoxy resin. The circuit pattern may include a data transfer pattern for transferring electrical data to the semiconductor package 198, a driving pattern for transmitting power to the semiconductor package 198, a ground pattern for electrically grounding the semiconductor package 198, etc. An upper insulation layer 210*c* and a lower insulation layer 210*b* may be formed on upper and lower surfaces of the core 210*a*, respectively. A via 220 may be formed in the core 210*a*.

An upper substrate pad 222 may be formed on an upper surface of the package substrate 210, and the upper substrate pad 222 may be electrically connected to the semiconductor package 198. A lower substrate pad 212 may be formed on a lower surface of the package substrate 210, and the lower substrate pad 212 may be electrically connected to an external terminal 214.

The upper substrate pad 222 may be bonded to the bump pattern 114 of the first semiconductor chip 10, which is the lowermost chip of the semiconductor package 198.

The mold layer 230 may be formed on the package substrate 210, and may cover the semiconductor package 198. The semiconductor package 198 may be fixed on the package substrate 210 by the mold layer 230, and the mold layer 230 may protect the semiconductor package 198.

The mold layer 230 may include an encapsulant to cover the semiconductor package 198 formed on the package substrate 210 and an underfill mold to fill a space between the semiconductor package 198 and the package substrate 210. In example embodiments, the mold layer 230 may include an epoxy mold compound (EMC).

As described above, an assembly structure 200 may include the semiconductor package 198 including stacked semiconductor chips therein. A vertical height of the semiconductor package 198 may be reduced, and an electrical short failure of the semiconductor package 198 may be decreased. Therefore, a height of the assembly structure 200 may be reduced, and a failure of the assembly structure 200 may be decreased. Further, the number of stacked semiconductor chips included in the assembly structure 200 having the same height may be increased.

Figure 15:
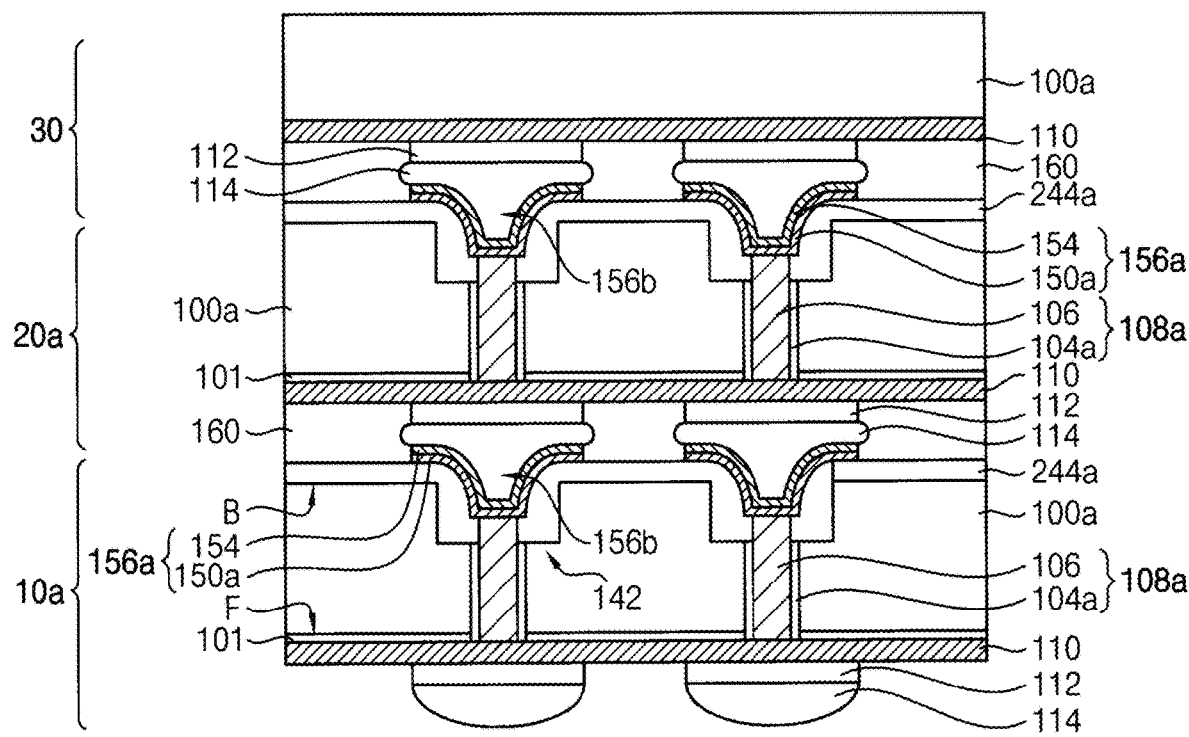

FIG. 15 is a cross-sectional view illustrating a semiconductor package in accordance with example embodiments.

The semiconductor package shown in FIG. 15 may be the same or substantially the same as the semiconductor package shown in FIG. 1, except for shapes of a second insulation liner pattern and a second pad pattern in each of semiconductor chips. Therefore, the same description may be simplified or omitted.

Referring to FIG. 15, the semiconductor package 198*a* may have a structure in which a first semiconductor chip 10*a*, a second semiconductor chip 20*a*, and/or a third semiconductor chip 30 are stacked in the vertical direction and bonded to each other.

In the first semiconductor chip 10*a*, a second insulation liner pattern 244*a* may be formed on the second surface B of the semiconductor substrate 100*a*, the inner surface of the recess 142, and the sidewall of the through via 106 protruding from a bottom of the recess 142. The second insulation liner pattern 244*a* may sufficiently fill the concave portion between the sidewall of the recess 142 and the upper sidewall of the through via 106. In example embodiments, the second insulation liner pattern 244*a* formed on the second surface B of the semiconductor substrate 100*a* may have a thickness greater than about ½ of a width of the concave portion between the sidewall of the recess 142 and the upper sidewall of the through via 106.

Only an upper surface of the through via 106 may be exposed by the second insulation liner pattern 244*a*. In example embodiments, the second insulation liner pattern 244*a* may include silicon oxide and/or silicon nitride.

The second pad pattern 156*a* may contact the upper surface of the through via 106, and may be electrically connected to the through via 106. The second pad pattern 156*a* may be conformally formed on the upper surface of the through via 106, the second insulation liner pattern 244*a* in the recess 142 and a portion of the second surface B of the semiconductor substrate 100*a*. In example embodiments, the second pad pattern 156*a* may not be disposed lower than the upper surface of the through via structure 108*a*.

An upper surface of the second pad pattern 156*a* may have a concave shape. A first recess 156*b* may be formed on the second pad pattern 156*a*.

A volume of the first recess 156b may be less than a volume of the bump pattern 114.

In example embodiments, the volume of the first recess 156b may be about 20% to about 95% of the volume of the bump pattern 114. In example embodiments, the volume of the first recess 156b may be about 50% to about 95% of the volume of the bump pattern 114.

The second semiconductor chip 20a may be stacked on the first semiconductor chip 10a.

In example embodiments, the second semiconductor chip 20a may have a structure the same or substantially the same as a structure of the first semiconductor chip 10a. The second semiconductor chip 20a may include the first pad pattern 112 and the bump pattern 114 on the first surface F of the semiconductor substrate 100a, and may include the second pad pattern 156a on the second surface B of the semiconductor substrate 100a. The second pad pattern 156a may contact the through via 106, and an upper surface of the second pad pattern 156a may have a concave shape.

The second pad pattern 156a of the first semiconductor chip 10a and the bump pattern 114 of the second semiconductor chip 20a may be bonded to each other.

The bump pattern 114 of the second semiconductor chip 20a may sufficiently fill the first recess 156b on the second pad pattern 156a of the first semiconductor chip 10a. Further, a portion of the bump pattern 114 may be formed above an inlet portion of the first recess 156b.

In addition, as illustrated with reference to FIG. 1, the third semiconductor chip 30, which is an uppermost semiconductor chip, may be stacked on the second semiconductor chip 20a.

FIGS. 16 to 19 are cross-sectional views illustrating a method of manufacturing a semiconductor package in accordance with example embodiments.

First, the processes illustrated with reference to FIGS. 2 to 5 may be performed to form the recess 142 on the second surface B of the semiconductor substrate 100a.

Figure 16:
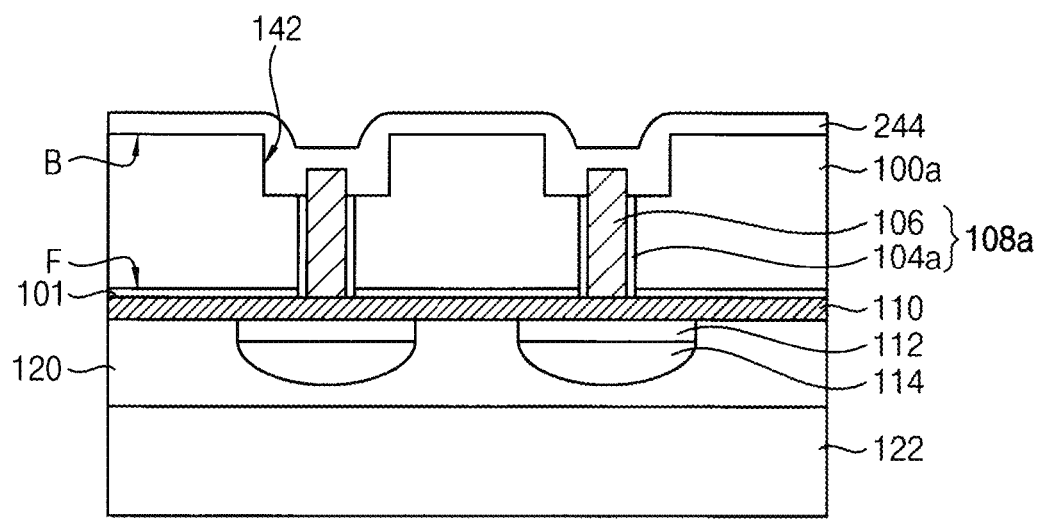

Referring to FIG. 16, a second insulation liner 244 may be conformally formed on the second surface B of the semiconductor substrate 100a, an inner surface of the recess 142, and an exposed surface of the through via structure 108a.

The second insulation liner 244 may be formed to sufficiently fill the concave portion between the sidewall of the recess 142 and the upper sidewall of the through via 106. In example embodiments, the second insulation liner 244 may have a thickness greater than ½ of a width between the sidewall of the recess 142 and the sidewall of the through via 106.

Figure 17:
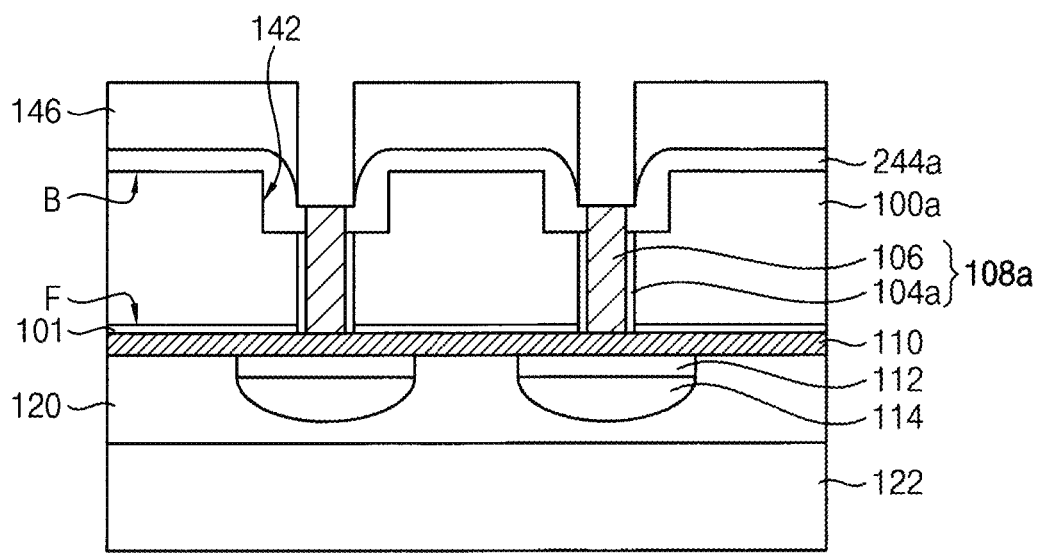

Referring to FIG. 17, a second etching mask 146 may be formed on the second insulation liner 244. The second insulation liner 244 may be etched using the second etching mask 146 to form a second insulation liner pattern 244a. Thus, only the upper surface of the through via 106 may be exposed by the second insulation liner pattern 244a. The second insulation liner pattern 244a may fill the concave portion between the sidewall of the recess 142 and the upper sidewall of the through via 106, so that the upper sidewall of the through via 106 may not be exposed.

Figure 18:
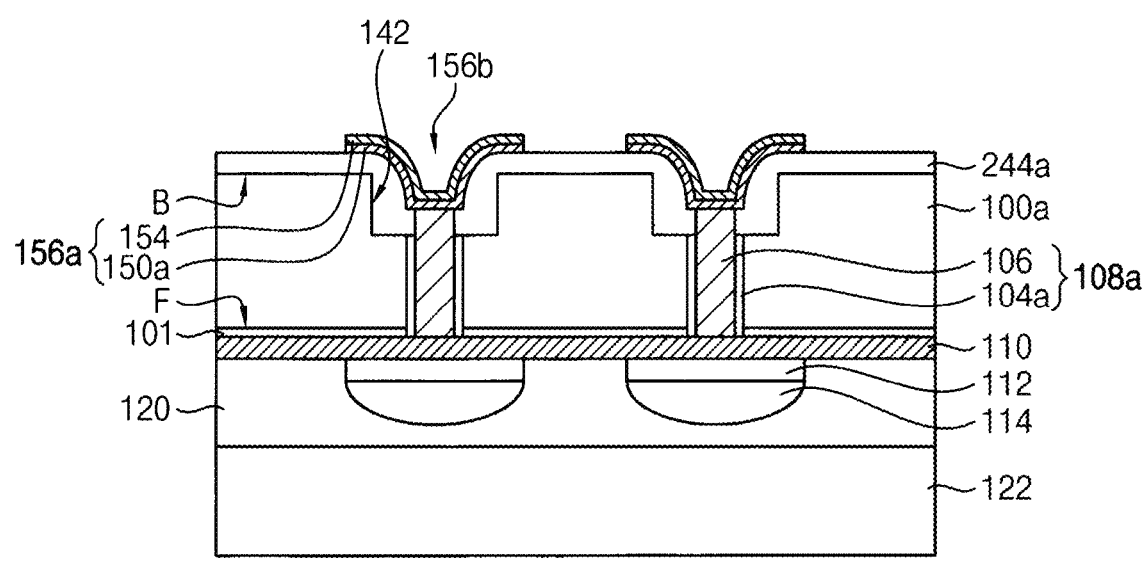

Referring to FIG. 18, the second pad pattern 156a may be formed on upper surfaces of the second insulation liner pattern 244a and the through via 106. The second pad pattern 156a may be formed by the processes illustrated with reference to FIGS. 8 to 10. An upper surface of the second pad pattern 156a may have a concave shape, and thus a first recess 156b may be formed on the second pad pattern 156a.

The second insulation liner pattern 244a may fill the concave portion between the upper sidewall of the through via structure 108a and the sidewall of the recess 142, so that the second pad pattern 156a may not be formed in the concave portion between the upper sidewall of the through via structure 108a and the sidewall of the recess 142.

By the above process, the first semiconductor chip 10a may be formed.

Figure 19:
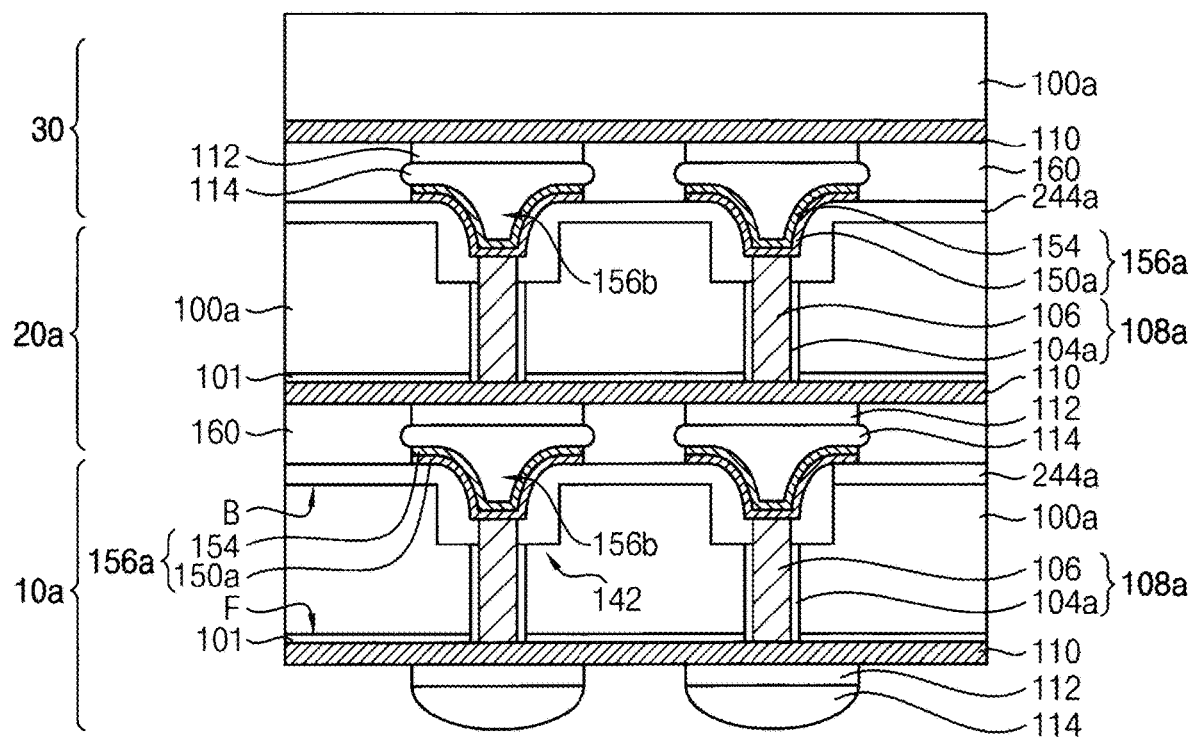

Referring to FIG. 19, the processes illustrated with reference to FIGS. 11 to 13 may be performed, so that the second and third semiconductor chips 20a and 30 may be sequentially stacked and bonded on the first semiconductor chip 10a. Thus, the semiconductor package shown in FIG. 19 may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor package, the method comprising:
   forming a through via structure in a first semiconductor substrate including a first surface and a second surface opposite to the first surface, the through via structure extending from the first surface toward the second surface so as not to be exposed on the second surface;
   etching the second surface of the first semiconductor substrate to form a recess, and wherein an upper sidewall and an upper surface of the through via structure are exposed in the recess;
   forming a first pad pattern on a surface of the recess and a surface of the through via structure in the recess, the first pad pattern including a first pad pattern recess;
   forming a bump pattern on the first surface of a second semiconductor substrate; and
   bonding the bump pattern of the second semiconductor substrate to the first pad pattern to form a bonding bump pattern filling in the first pad pattern recess.

2. The method of claim 1, wherein a volume of the first pad pattern recess is less than a volume of the bump pattern.

3. The method of claim 2, wherein the volume of the first pad pattern recess is 20% to 95% of a volume of the bump pattern.

4. The method of claim 1, wherein the bonding bump pattern is formed in inside the first pad pattern recess and above the first pad pattern recess, the bonding bump pattern includes a first portion inside the first pad pattern recess and a second portion above the first pad pattern recess, and a thickness of the first portion is greater than a thickness of the second portion.

5. The method of claim 1, further comprising, after the forming the recess:
forming an insulation liner on the second surface of the first semiconductor substrate, an inner surface of the recess, and the surface of the through via structure in the recess;
removing the insulation liner on the upper surface of the through via structure in the recess to form an insulation liner pattern on the second surface of the first semiconductor substrate, the inner surface of the recess, and the upper sidewall of the through via structure.

6. The method of claim 5, wherein the insulation liner pattern fills a concave portion between the upper sidewall of the through via structure and a sidewall of the recess.

7. The method of claim 5, wherein the first pad pattern contacts a surface of the insulation liner pattern in the recess, the upper surface of the through via structure, and a portion of the insulation liner pattern on the second surface of the first semiconductor substrate.

8. The method of claim 1, further comprising forming a first lower pad pattern and a first lower bump pattern on the first surface of the first semiconductor substrate.

9. The method of claim 1, wherein the forming the first pad pattern comprises:
forming a seed layer on the second surface of the first substrate, the surface of the recess, and the surface of the through via structure exposed in the recess;
forming a mask pattern on the seed layer, the mask pattern including an opening exposing the recess;
forming a metal pattern on the seed layer exposed by the opening;
removing the mask pattern; and
etching the seed layer using the metal pattern as a mask to form the first pad pattern including a seed pattern and a metal pattern.

10. The method of claim 1, further comprising before the forming the bump pattern on the first surface of the second semiconductor substrate:
forming a second lower pad pattern on the first surface of the second semiconductor substrate,
wherein the second lower pad pattern is formed between the bonding bump pattern and the first surface of the second semiconductor substrate.

11. The method of claim 1, further comprising before bonding the bump pattern of the second semiconductor substrate to the first pad pattern:
forming a non-conductive film on the first surface of the second semiconductor substrate to cover the bump pattern.

12. A method of manufacturing a semiconductor package, the method comprising:
forming a first semiconductor chip comprising:
forming a first through via structure in a first semiconductor substrate including a first surface and a second surface opposite to the first surface, the first through via structure extending from the first surface toward the second surface so as not to be exposed on the second surface;
forming a first bump pattern on the first surface of the first semiconductor substrate
etching the second surface of the first semiconductor substrate to form a first recess, and wherein an upper sidewall and an upper surface of the first through via structure are exposed in the first recess; and
forming a first pad pattern on a surface of the first recess and a surface of the first through via structure in the first recess, the first pad pattern including a first pad pattern recess;
forming a second semiconductor chip comprising:
forming a second through via structure in a second semiconductor substrate including a first surface and a second surface opposite to the first surface, the second through via structure extending from the first surface toward the second surface so as not to be exposed on the second surface;
forming a second bump pattern on the first surface of the second semiconductor substrate;
etching the second surface of the second semiconductor substrate to form a second recess, and wherein an upper sidewall and an upper surface of the second through via structure are exposed in the second recess; and
forming a second pad pattern on a surface of the second recess and a surface of the second through via structure in the second recess, the second pad pattern including a second pad pattern recess;
forming a third semiconductor chip including a third bump pattern on a first surface of a third semiconductor substrate;
bonding the second bump pattern of the second semiconductor substrate to the first pad pattern to form a first bonding bump pattern filling in the first pad pattern recess; and
bonding the third bump pattern of the third semiconductor substrate to the second pad pattern to form a second bonding bump pattern filling in the second pad pattern recess.

13. The method of claim 12, further comprising, after the forming the first recess:
forming a first insulation liner pattern on the second surface of the first semiconductor substrate, an inner surface of the first recess, and the upper sidewall of the first through via structure, after the forming the first recess; and
forming a second insulation liner pattern on the second surface of the second semiconductor substrate, an inner surface of the second recess, and the upper sidewall of the second through via structure, after the forming the second recess.

14. The method of claim 12, wherein the first pad pattern contacts a surface of the first insulation liner pattern in the first recess, the upper surface of the first through via structure, and a portion of the first insulation liner pattern on the second surface of the first semiconductor substrate, and
wherein the second pad pattern contacts a surface of the second insulation liner pattern in the second recess, the upper surface of the second through via structure, and a portion of the second insulation liner pattern on the second surface of the second semiconductor substrate.

15. The method of claim 12, wherein a volume of the first pad pattern recess is less than a volume of the second bump pattern, and
wherein a volume of the second pad pattern recess is less than a volume of the third bump pattern.

16. The method of claim 12, further comprising:
forming a first non-conductive film on the first surface of the second semiconductor substrate to cover the second bump pattern, before bonding the second bump pattern of the second semiconductor substrate to the first pad pattern; and forming a second non-conductive film on the first surface of the third semiconductor substrate to cover the third bump pattern, before bonding the third bump pattern of the third semiconductor substrate to the second pad pattern.

17. A method of manufacturing a semiconductor package, the method comprising:

forming a first semiconductor chip comprising:

forming a through via structure in a first semiconductor substrate including a first surface and a second surface opposite to the first surface, the through via structure extending from the first surface toward the second surface so as not to be exposed on the second surface;

etching the second surface of the first semiconductor substrate to form a first recess, and an upper sidewall and an upper surface of the through via structure are exposed in the first recess;

forming a first insulation liner pattern on the second surface of the first semiconductor substrate, an inner surface of the first recess, and the upper sidewall of the through via structure; and forming a first pad pattern contacting the first insulation liner pattern and the upper surface of the through via structure, the first pad pattern including a first pad pattern recess;

forming a second semiconductor chip including a bump pattern on a first surface of a second semiconductor substrate; and bonding the bump pattern of the second semiconductor substrate to the first pad pattern to form a first bonding bump pattern filling in the first pad pattern recess, wherein the first bonding bump pattern protruding from an upper portion of the first pad pattern recess.

18. The method of claim 17, wherein a width of the recess is greater than a width of the through via structure.

19. The method of claim 17, wherein the upper surface of the through via structure is lower than the second surface of the first semiconductor substrate.

20. The method of claim 17, wherein the forming the insulation liner pattern comprises:

forming an insulation liner on the second surface of the first semiconductor substrate, an inner surface of the recess, and a surface of the through via structure inside the recess; and removing the insulation liner on the upper surface of the through via structure inside the recess.

* * * * *